United States Patent
Yoshioka et al.

(10) Patent No.: US 10,818,630 B2
(45) Date of Patent: Oct. 27, 2020

(54) SEMICONDUCTOR DEVICE

(71) Applicant: Mitsubishi Electric Corporation, Tokyo (JP)

(72) Inventors: Yuki Yoshioka, Tokyo (JP); Taishi Sasaki, Tokyo (JP); Hiroyuki Harada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/347,368

(22) PCT Filed: Nov. 21, 2016

(86) PCT No.: PCT/JP2016/084500
§ 371 (c)(1),
(2) Date: May 3, 2019

(87) PCT Pub. No.: WO2018/092319
PCT Pub. Date: May 24, 2018

(65) Prior Publication Data
US 2019/0378810 A1    Dec. 12, 2019

(51) Int. Cl.
*H01L 23/28* (2006.01)
*H01L 23/00* (2006.01)
(Continued)

(52) U.S. Cl.
CPC ............ *H01L 24/32* (2013.01); *H01L 23/293* (2013.01); *H01L 23/3672* (2013.01);
(Continued)

(58) Field of Classification Search
CPC ....... H01L 2924/3511; H01L 2924/181; H01L 2224/48091; H01L 26/16; H01L 24/13;
(Continued)

(56) References Cited

U.S. PATENT DOCUMENTS 8,766,426 B2 * 7/2014 Goh ..................... H01L 23/10
257/690
2006/0199310 A1 * 9/2006 Nakabayashi ...... H01L 21/8221
438/128
(Continued)

FOREIGN PATENT DOCUMENTS

JP    2003-209199 A    7/2003
JP    2003-224275 A    8/2003
(Continued)

OTHER PUBLICATIONS

An Office Action; "Notification of Reasons for Refusal," mailed by the Japanese Patent Office dated Dec. 10, 2019, which corresponds to Japanese Patent Application No. 2018-551010 and is related to U.S. Appl. No. 16/347,368; with English language translation.
(Continued)

*Primary Examiner* — S. V. Clark
(74) *Attorney, Agent, or Firm* — Studebaker & Brackett PC

(57) ABSTRACT

An object of the present invention is to provide a highly reliable semiconductor device that allows voids remaining in a bonding material to be reduced. The semiconductor device includes a semiconductor chip, an insulation substrate, a metal base plate, a resin section, and a bump. The semiconductor chip is warped into a concave shape. On the insulation substrate, the semiconductor chip is mounted by bonding. The metal base plate has the insulation substrate mounted thereon and has a heat dissipation property. The resin section seals the insulation substrate and the semiconductor chip. The bump is disposed in a joint between the semiconductor chip and the insulation substrate. A warp amount of the semiconductor chip warped into a concave shape is equal to or greater than 1 μm and less than a height of the bump.

11 Claims, 5 Drawing Sheets

(51) Int. Cl.
H01L 23/29     (2006.01)
H01L 23/367    (2006.01)
H01L 23/495    (2006.01)

(52) U.S. Cl.
CPC ........ H01L 23/49568 (2013.01); H01L 24/16 (2013.01); *H01L 2924/3511* (2013.01)

(58) Field of Classification Search
CPC ......... H01L 2224/16227; H01L 21/563; H01L 2224/96
USPC ................ 357/787, 666, 706, 707, 778, 797
See application file for complete search history.

(56) References Cited

U.S. PATENT DOCUMENTS

| | | | | |
|---|---|---|---|---|
| 2012/0068341 | A1* | 3/2012 | Lieu | ........................ H01L 21/56 257/738 |
| 2014/0256030 | A1* | 9/2014 | Shen | ........................ B29C 65/72 435/287.3 |
| 2015/0171028 | A1* | 6/2015 | Jo | ........................ H01L 23/3128 257/713 |
| 2017/0186721 | A1* | 6/2017 | Kira | ........................ H01L 25/04 |

FOREIGN PATENT DOCUMENTS

| | | |
|---|---|---|
| JP | 2003-273357 A | 9/2003 |
| JP | 2016-111111 A | 6/2016 |
| JP | 2016-181607 A | 10/2016 |

OTHER PUBLICATIONS

International Search Report issued in PCT/JP2016/084500; dated Jan. 31, 2017.
An Office Action mailed by the German Patent Office dated Jul. 7, 2020, which corresponds to German Patent Application No. 112016007464.6 and is related to U.S. Appl. No. 16/347,368; with English language translation.

* cited by examiner

SEMICONDUCTOR DEVICE

TECHNICAL FIELD

The present invention relates to semiconductor devices such as an insulated gate bipolar transistor (IGBT), a metal-oxide-semiconductor field-effect transistor (MOSFET), and a diode, and more particularly to a semiconductor device capable of suppressing generation of voids in a bonding material between a semiconductor chip and an insulation substrate to improve reliability.

BACKGROUND ART

In typical semiconductor devices, a structure in which a semiconductor chip is bonded to a pattern of, for example, an insulation substrate via a bonding material has been used. In recent years, semiconductor chips are becoming thinner for the purpose of improving electrical characteristics to, for example, reduce costs and energy loss, but on the contrary, the semiconductor chips tend to be more largely warped into a convex shape. As a result, during a process of bonding with a bonding material, voids remain in the bonding material along the warp of the semiconductor chip, which deteriorates heat dissipation performance of the semiconductor device. Furthermore, when the semiconductor device is used for a long time, a problem that reliability of the semiconductor device is deteriorated due to the voids remaining in the bonding material has become conspicuous.

For example, Patent Document 1 discloses a technique capable of suppressing a warp of a semiconductor chip using a bimetal effect that is achieved by forming a frame of an insulation thick film on an upper surface side of a semiconductor chip, more specifically, on a periphery on an emitter electrode side of the semiconductor chip. A beam is further formed across this frame to suppress a warp of the semiconductor chip due to a bimetal effect, thereby reducing voids.

Further, for example, Patent Document 2 discloses a technique to reduce a warp amount using a bimetal effect exhibited by a semiconductor chip in which a back electrode is divided to form slits in accordance with an emitter electrode division pattern and a stripe-shaped gate electrode pattern as front electrode patterns, thereby reducing voids.

PRIOR ART DOCUMENTS

Patent Documents

Patent Document 1: Japanese Patent Application Laid-Open No. 2003-273357
Patent Document 2: Japanese Patent Application Laid-Open No. 2003-224275

SUMMARY

Problem to be Solved by the Invention

However, the techniques described in Patent Documents 1, 2 merely reduce a convex warp of a semiconductor chip, and when voids are generated in the bonding material, the voids move upward. Therefore, it is difficult to reduce voids remaining in the bonding material merely by reducing the warp amount of the semiconductor chip warped into a convex shape, thereby making it difficult to manufacture a highly reliable semiconductor device.

It is therefore an object of the present invention to provide a highly reliable semiconductor device in which voids remaining in a bonding material are reduced.

Means to Solve the Problem

A semiconductor device according to the present invention includes a semiconductor chip having a concave warp, an insulation substrate on which the semiconductor chip is mounted by bonding, a base plate on which the insulation substrate is mounted, the base plate having a heat dissipation property, a resin section that seals the insulation substrate and the semiconductor chip, and a bump disposed in a joint between the semiconductor chip and the insulation substrate. A warp amount of the semiconductor chip warped into a concave shape is equal to or greater than 1 µm and less than a height of the bump.

Effects of the Invention

According to the present invention, the semiconductor device includes the semiconductor chip warped into a concave shape, the insulation substrate on which the semiconductor chip is mounted by bonding, the base plate on which the insulation substrate is mounted, the base plate having a heat dissipation property, the resin section that seals the insulation substrate and the semiconductor chip, and the bump disposed in the joint between the semiconductor chip and the insulation substrate, and the warp amount of the semiconductor chip warped into a concave shape is equal to or greater than 1 µm and less than the height of the bump.

Therefore, voids remaining in the bonding material are easily released to the outside of the bonding material, thereby allowing the voids remaining in the bonding material to be reduced. This allows a highly reliable semiconductor device to be realized.

The object, features, aspects, and advantages of the present invention will become more apparent from the following detailed description and the accompanying drawings.

DESCRIPTION OF EMBODIMENTS

First Embodiment

Figure 1:
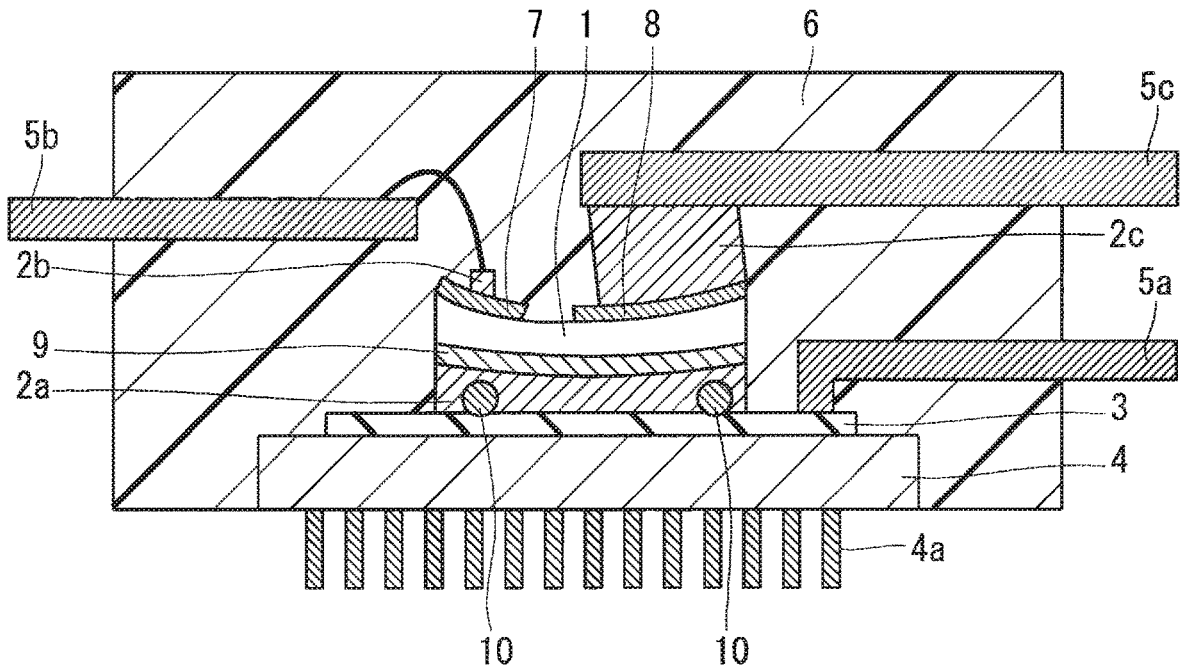
FIG. 1 is a cross-sectional view of a semiconductor device according to a first embodiment.

A first embodiment of the present invention will be described below with reference to the drawings. FIG. 1 is a cross-sectional view of a semiconductor device according to the first embodiment.

The semiconductor device according to the first embodiment is a semiconductor power module widely used for, for example, household appliances, industrial applications, automobiles, trains, and the like. As shown in FIG. 1, the semiconductor device mainly includes a semiconductor chip 1, bonding materials 2a, 2b, 2c, an insulation substrate 3, a metal base plate 4, lead frames 5a, 5b, 5c, a resin section 6, and a bump 10.

The semiconductor chip 1 is, for example, a vertical IGBT that is warped into a concave shape by a method described later. Herein, the concave shape corresponds to a shape in which a height position of at least part of a periphery of an upper surface of the semiconductor chip 1 is higher than a height position of a center portion of the upper surface. The semiconductor chip 1 is mounted on an upper surface of the insulation substrate 3 via the bonding material 2a.

Further, in FIG. 1, only one semiconductor chip 1 is mounted on the upper surface of one insulation substrate 3, but the present invention is not limited to this configuration. On the insulation substrate 3, a required number of semiconductor chips 1 can be mounted in accordance with uses.

On the upper surface of the semiconductor chip 1, a gate electrode 7 and an emitter electrode 8 are formed as an upper electrode. On a lower surface of the semiconductor chip 1, a collector electrode 9 is formed as a lower electrode. The gate electrode 7 and the emitter electrode 8 are each made of, for example, a material with an aluminum content of 95% or more. The collector electrode 9 is made of a metal laminated film to have a bonding property with respect to the bonding material 2a. The metal laminated film making up the collector electrode 9 is made of, for example, Ti/Ni/Au or AlSi/Ti/Ni/Au in order from the semiconductor chip 1 side. The collector electrode 9 is bonded to the insulation substrate 3 via the bonding material 2a.

Note that the respective materials of the gate electrode 7, the emitter electrode 8, and the collector electrode 9 are changed in accordance with a method for warping the semiconductor chip 1 (to be described later) into a concave shape.

The insulation substrate 3 has an electrode pattern and is mounted on an upper surface of the metal base plate 4. The insulation substrate 3 is made of a material having high heat conductivity, and transfers heat generated in the semiconductor chip 1 to the metal base plate 4.

Further, copper or aluminum is used for the electrode pattern of the insulation substrate 3 and the metal base plate 4, but the present invention is not limited to this configuration, and any material may be used as long as the material has a required heat dissipation property. For the electrode pattern of the insulation substrate 3 and the metal base plate 4, for example, a material such as iron or an iron composite material may be used.

Furthermore, respective surfaces of the electrode pattern of the insulation substrate 3 and the metal base plate 4 may be nickel-plated, but the present invention is not limited to this configuration. The respective surfaces of the electrode pattern of the insulation substrate 3 and the metal base plate 4 may be gold-plated or tin-plated, and any structure may be used as long as the structure allows a required current and voltage to be supplied to the semiconductor chip 1.

Further, at least part of the electrode pattern of the insulation substrate 3 may have fine irregularities on its surface in order to improve adhesion to resin, or an adhesion improver such as a primer treatment is applied to the surface. For example, a silane coupling agent, polyimide, an epoxy resin, or the like is used as the adhesion improver, but the adhesion improver is not particularly limited to such a substance, and any material may be used as long as the material is capable of improving the adhesion between the electrode pattern of the insulation substrate 3 and the resin section 6.

Further, the insulation substrate 3 may be an insulation substrate that is made of ceramics such as $Al_2O_3$, $SiO_2$, AlN, BN, or $Si_3N_4$ and on which an electrode pattern made of copper or aluminum is formed. The insulation substrate 3 is required to have a heat dissipation property and an insulation property. The insulation substrate 3 is, however, not limited to the above configuration and may be a substrate that is made of cured resin in which ceramic powder is scattered or cured resin in which a ceramic plate is embedded and on which an electrode pattern is formed.

Further, $Al_2O_3$, $SiO_2$, AlN, BN, $Si_3N_4$, or the like is used as the ceramic powder used for the insulation substrate 3, but the ceramic powder is not limited to such a material, and diamond, SiC, or $B_2O_3$ may be used. Such powder often has a spherical shape, but the shape of the powder is not limited to the spherical shape and may be of shatters, granular, flake-like, of an agglomerate, or the like. A filling amount of the powder may be an amount that allows a required heat dissipation property and insulation property to be exhibited.

Further, for the insulation substrate 3, an epoxy resin, a polyimide resin, a silicone resin, an acrylic resin, or the like may be used, and any material may be used as long as the material has a required insulation property and adhesiveness.

Further, in the first embodiment, the insulation substrate 3 and the metal base plate 4 are separately formed and are bonded to each other with a bonding material, but the insulation substrate and the metal base plate may be integrally formed.

The metal base plate 4 has a plurality of fins 4a on its lower surface to exhibit a heat dissipation property. The metal base plate 4 dissipates the heat of the semiconductor chip 1 transferred through the insulation substrate 3 to the outside of the semiconductor device.

The lead frames 5b, 5c are connected to an upper surface of the gate electrode 7 and an upper surface of the emitter electrode 8 via the bonding materials 2b, 2c, respectively. Further, the lead frame 5a is connected to an end portion on the upper surface of the insulation substrate 3.

As the lead frames 5a, 5b, 5c, a wire made of aluminum or gold having a circular cross section is used, but the material of the lead frames is not limited to such a material. For example, a belt-shaped copper plate having a rectangular cross section may be used. Further, in FIG. 1, three lead frames 5a, 5b, 5c are bonded to the semiconductor chip 1, but the present invention is not limited to this configuration. A required number of lead frames may be bonded in accordance with a current density of the semiconductor chip 1 or the like. Further, for the bonding of the lead frames 5a, 5b, 5c, molten metal resulting from melting a metal piece made of, for example, copper or tin, or ultrasonic bonding is used, but any bonding method may be used as long as a supply of a required current and voltage to the semiconductor chip 1 is achieved.

The resin section 6 seals an upper portion of the metal base plate 4, the insulation substrate 3, and the semiconductor chip 1. Note that, for the resin section 6, for example, an epoxy resin is used, but the material of the resin section 6 is not limited to such a material. Any resin may be used as long as the resin has required elastic modulus, heat resistance, insulation property, and adhesiveness. For example, in addition to the epoxy resin, a silicone resin, a urethane resin, a polyimide resin, a polyamide resin, a polyamide imide resin, an acrylic resin, or the like may be used. In the first embodiment, the resin section 6 fills a resin case that is formed to cover the semiconductor chip 1 and the insulation substrate 3 and is bonded to the metal base plate 4, but the semiconductor device may have a molded structure that has no resin case.

The bump 10 is disposed in a joint between the semiconductor chip 1 and the insulation substrate 3. More specifically, the bump 10 is disposed in the bonding material 2a between the collector electrode 9 formed on the lower surface of the semiconductor chip 1 and the insulation substrate 3. Note that the details of the bump 10 will be described later.

Figure 2:
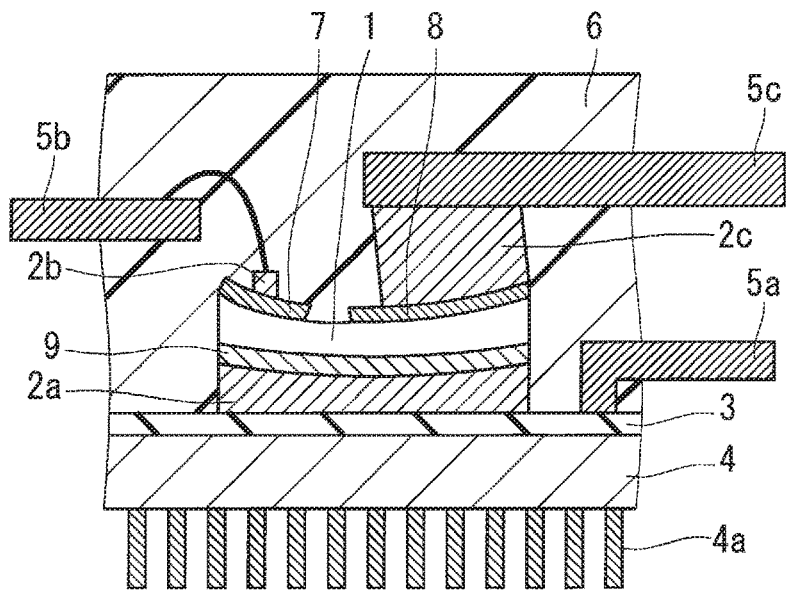
FIG. 2 is a cross-sectional view of a main part for describing a method for manufacturing the semiconductor device according to the first embodiment.
Figure 3:
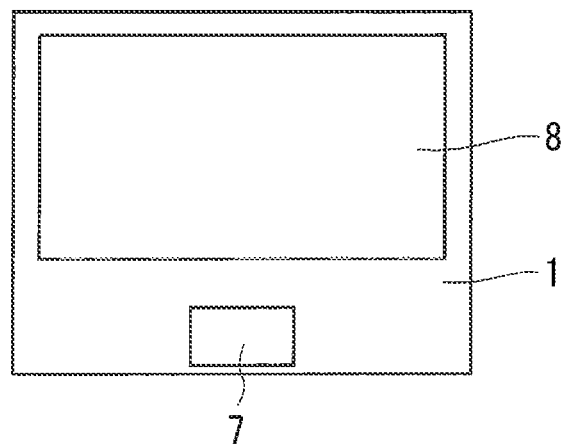
FIG. 3 is a plan view of a semiconductor chip of the semiconductor device according to the first embodiment.

Next, a method for warping the semiconductor chip 1 into a concave shape will be described. FIG. 2 is a cross-sectional view of a main part for describing a method for manufacturing the semiconductor device. FIG. 3 is a plan view of the semiconductor chip 1 of the semiconductor device. Note that, in FIG. 2, the bump 10 is omitted for the sake of easy viewing, and the same applies to the following drawings.

As shown in FIG. 2, the gate electrode 7 and the emitter electrode 8 each made of a metal laminated film are formed on the upper surface of the semiconductor chip 1. On the lower surface of the semiconductor chip 1, the collector electrode 9 made of a metal laminated film is formed. The gate electrode 7 and the emitter electrode 8 are each made of a material having a linear expansion coefficient greater than a linear expansion coefficient of a material making up the collector electrode 9. As described above, the upper electrode and the lower electrode made of materials having different linear expansion coefficients are formed on the upper surface and lower surface of the semiconductor chip 1, respectively, which makes respective stresses generated on the upper surface side and lower surface side of the semiconductor chip 1 different from each other. Utilizing the stresses allows the semiconductor chip 1 to be warped. Note that AlSi, Cu, Au, Ag, Ti, or Ni can be adopted for the upper electrode and lower electrode of the semiconductor chip 1. Making the respective materials of the upper electrode and lower electrode of the semiconductor chip 1 different from each other allows the respective linear expansion coefficients of the upper electrode and the lower electrode to be different from each other. Specifically, for example, AlSi or the like is adopted for the gate electrode 7 and the emitter electrode 8 as the upper electrode, and Cu or the like is adopted for the collector electrode 9 as the lower electrode.

In a case of FIG. 2, stress generated on the upper surface side of the semiconductor chip 1 is greater than stress generated on the lower surface side, thereby allowing the semiconductor chip 1 to be warped into a concave shape. Specifically, as shown in FIG. 3, it is possible to deform the semiconductor chip 1 to position at least part of the periphery on the upper surface of the semiconductor chip 1 higher than the center portion.

Further, it is also possible that annealing is performed at a temperature higher than a temperature at which a lamination forming process and a machining process are performed after the formation of the gate electrode 7 and the emitter electrode 8 on the upper surface of the semiconductor chip 1, and remarkably large stress is applied to the gate electrode 7 and the emitter electrode 8 on the upper surface of the semiconductor chip 1 to warp the semiconductor chip 1 into a concave shape. After the semiconductor chip 1 is warped into a concave shape, the collector electrode 9 is formed on the lower surface of the semiconductor chip 1.

Figure 4:
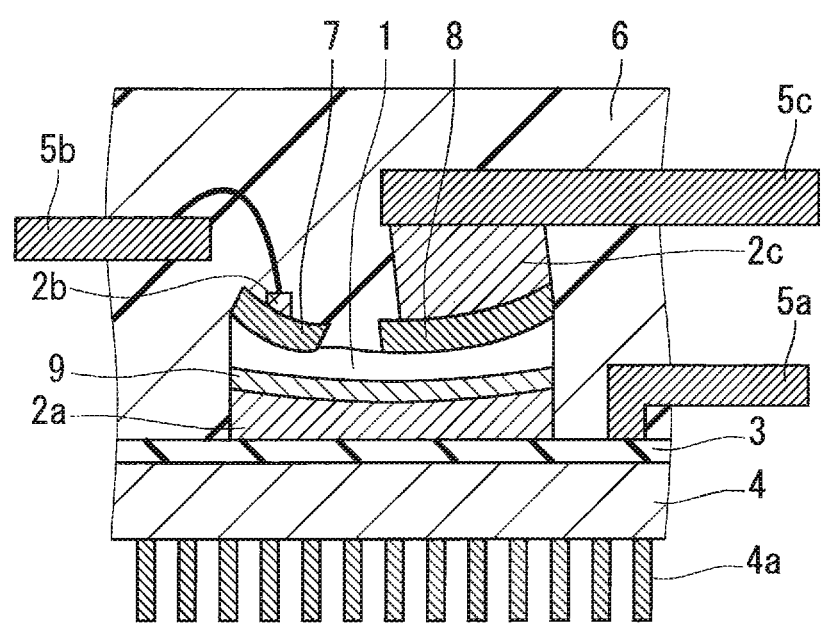
FIG. 4 is a cross-sectional view of the main part for describing the method for manufacturing the semiconductor device according to the first embodiment.

As shown in FIG. 4, the gate electrode 7 and the emitter electrode 8, and the collector electrode 9 having different thicknesses are formed on the upper surface and lower surface of the semiconductor chip 1, and a difference in magnitude between stresses generated on the upper surface side and lower surface side of the semiconductor chip 1 also allows semiconductor chip 1 to be warped. FIG. 4 is a cross-sectional view of the main part for describing the method for manufacturing the semiconductor device.

In a case of FIG. 4, the gate electrode 7 and the emitter electrode 8 formed on the upper surface of the semiconductor chip 1 are thicker than the collector electrode 9 formed on the lower surface of the semiconductor chip 1, thereby generating stress on the upper surface side of the semiconductor chip 1 that is larger than stress generated on the lower surface side to allow the semiconductor chip 1 to be warped into a concave shape.

Further, the semiconductor chip 1 is set on the upper surface of the insulation substrate 3 via the bonding material 2a in a state where the insulation substrate 3 formed in a concave shape is set on the metal base plate 4, and the semiconductor chip 1 is pressed from the upper surface side, thereby allowing the semiconductor chip 1 to be warped into a concave shape.

Figure 5:
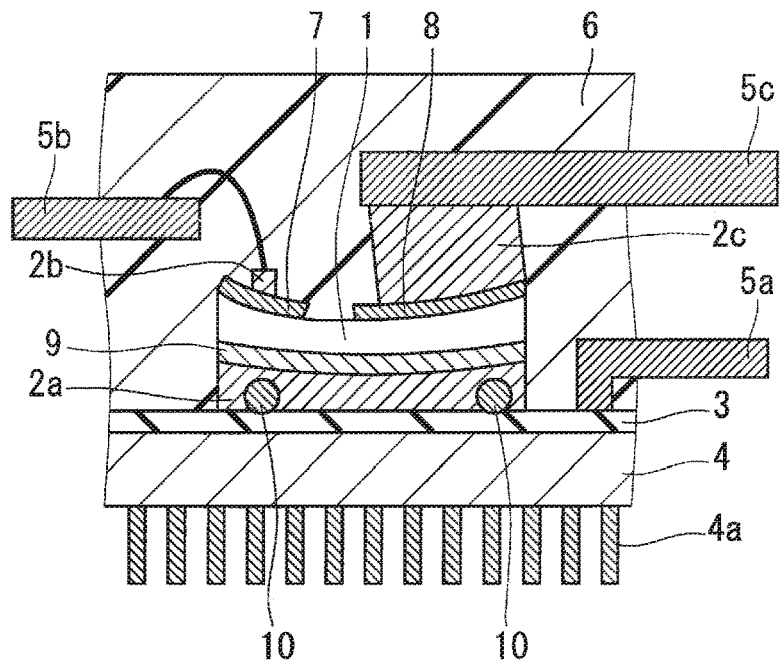
FIG. 5 is a cross-sectional view of the main part of the semiconductor device according to the first embodiment.

Next, the bump 10 disposed in the joint between the semiconductor chip 1 and the insulation substrate 3 will be described. FIG. 5 is a cross-sectional view of the main part of the semiconductor device according to the first embodiment.

As shown in FIG. 5, the bump 10 is an aluminum bump, and four bumps 10 are arranged on the upper surface of the insulation substrate 3, for example. The four bumps 10 are arranged, for example, at positions corresponding to corners on the lower surface of the semiconductor chip 1, thereby allowing the semiconductor chip 1 to be prevented from being tilted during a process of bonding with bonding material 2a.

In general, the semiconductor chip 1 is mounted on the insulation substrate 3 via the bonding material 2a, which requires the bonding material 2a to have a property of dissipating heat given off by the semiconductor chip 1. When the semiconductor chip 1 is bonded to a desired position on the insulation substrate 3, if the thickness of the bonding material 2a under the semiconductor chip 1 is not uniform, a highly reliable semiconductor device cannot be produced. Furthermore, when the semiconductor chip 1 is tilted at the time of bonding the semiconductor chip 1, a portion where the bonding material 2a is not present, that is, an air layer is formed in part under the semiconductor chip 1. The presence of this air layer raises a concern about deterioration of the heat dissipation property.

Further, in a case where the semiconductor chip 1 is tilted, when the amount of the bonding material 2a is increased in order to make the bonding material 2a present under the semiconductor chip 1, the bonding material 2a after bonding becomes thicker, which leads to a problem of an increase in thermal resistance.

In order to solve the above problem, as shown in FIG. 5, it is preferable that the bumps 10 be arranged in the bonding material 2a that serves the joint between the semiconductor chip 1 and the insulation substrate 3, that is, a bump structure be adopted.

Arranging the bumps 10 in the joint between the semiconductor chip 1 and the insulation substrate 3 allows the semiconductor chip 1 to be prevented from being tilted during the process of bonding with bonding material 2a. Further, the height position of the semiconductor chip 1 is not lower than upper ends of the bumps 10, thereby allowing stable bonding of the semiconductor chip 1.

The height of the bumps 10 is not particularly specified, but, in consideration of an increase in thermal resistance due to the large thickness of the bonding material 2a, the height is preferably equal to or less than 130 µm.

Further, the position, the interval, and the number of bumps 10 to be arranged with respect to one semiconductor chip 1 and the bonding material 2a are not particularly specified, but in order to prevent the semiconductor chip 1 from being tilted, at least three or more bumps 10 are required. In order to uniformly arrange the semiconductor chip 1 in a well-balanced manner, it is preferable that the four bumps 10 be arranged at four corners of the semiconductor chip 1 at equal intervals.

Further, it is conceivable that the bumps 10 are bonded to the insulation substrate 3 by ultrasonic bonding with, for example, aluminum wires, but any other material or bonding method may be used as long as the bumps 10 can play their roles.

With a configuration where the bump structure is not adopted, if a semiconductor chip has a conventional convex shape, corners of the semiconductor chip tends to be closer to an insulation substrate than a center portion of the semiconductor chip with the semiconductor chip mounted on the insulation substrate.

On the other hand, in the first embodiment, since the semiconductor chip 1 has a concave shape, the corners of the semiconductor chip 1 tend to be more distant from the insulation substrate 3 than the center portion of the semiconductor chip 1 with the semiconductor chip 1 mounted on the insulation substrate 3. This leads to an increase in thickness of the bonding material 2a and thereby raises a concern about deterioration in heat dissipation.

With a configuration where the bump structure is adopted, the semiconductor chip 1 is prevented from being tilted with respect to the insulation substrate 3 with the semiconductor chip 1 having a concave shape mounted on the insulation substrate 3, thereby allowing the bonding material 2a to maintain a uniform thickness in a stable manner. This allows a highly reliable semiconductor device to be produced.

Further, in the semiconductor device having the bump structure, mounting a semiconductor chip having a convex shape raises concern that voids may remain in a bonding material due to the shape of the semiconductor chip, whereas the use of the semiconductor chip 1 having a concave shape allows voids in the bonding material 2a under the semiconductor chip 1 to be efficiently released to the outside of the bonding material 2a through side surfaces of the semiconductor chip 1.

Furthermore, the use of the semiconductor chip having a convex shape causes the bonding material under of the semiconductor chip to have the largest thickness at the center portion of the semiconductor chip, whereas the use of the semiconductor chip 1 having a concave shape causes the bonding material to have the largest thickness on the periphery of the semiconductor chip 1. While a semiconductor chip is in operation, the center portion of the semiconductor chip has the highest temperature; therefore, a semiconductor device including a semiconductor chip having a concave shape that makes a bonding material at the center portion of the semiconductor chip thinner has a better heat dissipation property and thereby has higher reliability.

As described above, adopting the bump structure into the semiconductor chip 1 having a concave shape is effective in improving the reliability of the semiconductor device. However, when a warp amount of the semiconductor chip 1 warped into a concave shape is greater than the height of the bumps 10, a portion having a maximum height of the semiconductor chip 1 may come into contact with the insulation substrate 3 even with the bump structure. This prevents the bump structure from exhibiting the effect of stabilizing the thickness of the bonding material 2a. Therefore, it is necessary to make the warp amount of the semiconductor chip 1 warped into a concave shape less than the height of the bumps 10. Specifically, the warp amount of the semiconductor chip 1 warped into a concave shape is equal to or greater than 1 µm and less than the height of the bumps 10. Note that the warp amount of the semiconductor chip 1 warped into a concave shape corresponds to a height from one end point of the lower surface of the semiconductor chip 1 to a portion having the maximum height of the semiconductor chip 1.

In general, the thickness of a semiconductor chip is equal to or greater than 500 µm, and stress generated due to the structure of the semiconductor chip hardly affects the warp of the semiconductor chip. On the other hand, when the thickness of the semiconductor chip is equal to or less than 100 µm, the semiconductor chip is warped into a convex shape due to the structure of the semiconductor chip, which causes voids to remain in the bonding material. The smaller the thickness of the semiconductor chip, the more the warp amount of the semiconductor chip, and when the semiconductor chip has a thickness of about 100 µm, the warp amount may reach 200 µm. Therefore, in the first embodiment, the use of a semiconductor chip having a thickness of 100 µm or less as the semiconductor chip 1 significantly exhibits the effect.

Further, as shown in FIGS. 1, 2, 4, and 5, the lead frame 5b is bonded to the gate electrode 7 via the bonding material 2b, and the lead frame 5c is bonded to the emitter electrode 8 via the bonding material 2c. The bonding materials 2b, 2c are, however, cured and shrunk during cooling, which generates upward stress in the semiconductor chip 1 and thereby easily forms the semiconductor chip 1 into a convex shape. Since the conventional semiconductor chip has a convex shape, with stress applied to the upper surface side of the semiconductor chip 1 from the beginning, further stress is applied to the upper surface side of the semiconductor chip 1 at the time of bonding.

On the other hand, since the semiconductor chip 1 of the semiconductor device according to the first embodiment is formed in a concave shape, the application of upward stress does not bring the semiconductor chip 1 into a convex shape, and not only the stress applied to the upper surface side of the semiconductor chip 1 at the time of bonding is alleviated, but it is also advantageous in terms of the heat dissipation property.

Further, for the conventional semiconductor device with a semiconductor chip having a convex shape, it is difficult to control wet spreading and scattering of a bonding material, which makes adhesion to a resin section lower due to the bonding material spreading over the upper surface of the semiconductor chip.

On the other hand, for the semiconductor device according to the first embodiment, even when upward stress is applied, the semiconductor chip 1 is not brought into a convex shape, which makes it possible to suppress wet spreading of the bonding material 2a.

Figure 6:
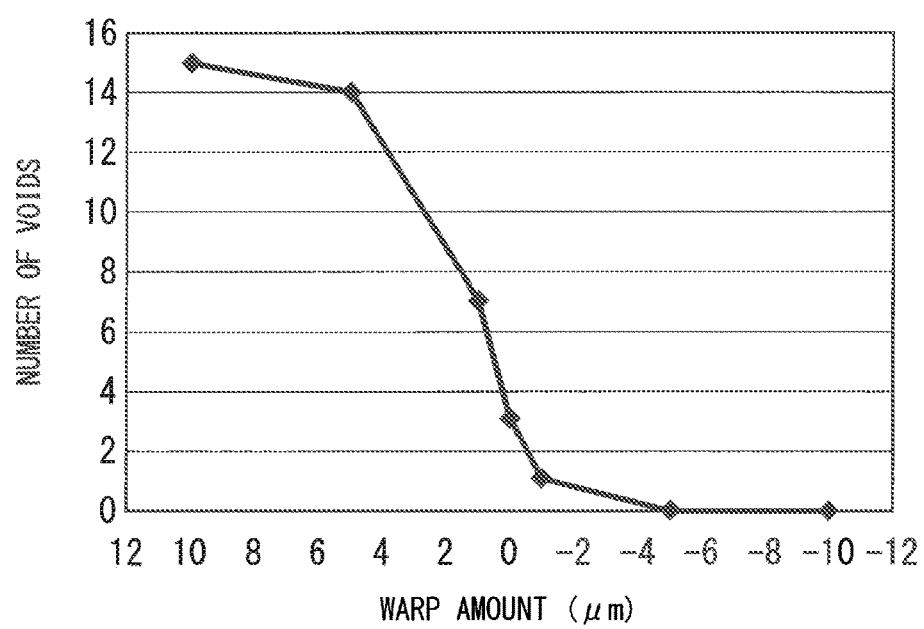
FIG. 6 is a graph showing a relation between a warp amount of and a residual void number in the semiconductor chip of the semiconductor device according to the first embodiment.

Next, a description will be given of results of evaluating the warp amount of the semiconductor chip and the number of voids remaining in the bonding material (hereinafter, also referred to as "residual void number") using evaluation samples of the semiconductor device according to the first embodiment. FIG. 6 is a graph showing a relation between the warp amount of the semiconductor chip of the semiconductor device and the residual void number.

As an evaluation sample of a semiconductor chip, a semiconductor chip having a thickness of 100 μm, a length of 9.8 mm, and a width of 9.8 mm, and warped into a concave shape was used. For calculation of the warp amount, a height on a straight line between two corners diagonally facing each other of the four corners are measured with a three-dimensional laser microscope from the upper surface side of the semiconductor chip, and a value is obtained by subtracting a minimum value of the height thus measured from a maximum value. A height on a straight line between the other two corners was also calculated in the same manner, and an average value of the heights on the two straight lines thus calculated was taken as the warp amount.

Further, for a concave shape and convex shape of the evaluation samples, a shape in which the center portion on the upper surface of the semiconductor chip is higher than the corners on the upper surface is taken as a shape bent in a plus direction, that is, a convex shape, and a shape in which the center portion on the upper surface of the semiconductor chip is lower than the corners on the upper surface is take as a shape bent in a minus direction, that is, a concave shape. The evaluation samples were produced such that their respective warp amounts are +10 μm, +5 μm, +1 μm, 0 μ, −1 μm, −5 μm, and −10 μm.

Further, the evaluation samples were produced by a procedure in which the semiconductor chip was warped by the predetermined warp amount and was then bonded, via a bonding material made of solder containing flux, to an upper surface of the insulation substrate 3 that is a substrate made of AlN ceramics and having a Cu electrode pattern formed on both an upper surface and a lower surface of the substrate. The bonding with the bonding material was made using a hot plate under atmospheric pressure environment. The residual void number in the bonding material was evaluated by an X-ray transmission apparatus.

For the evaluation of the residual void number, voids of 500 μm or more in the bonding material were counted, and the evaluation is performed on eight evaluation samples for each warp amount, and an average value of the counts was calculated.

As shown in FIG. 6, in the evaluation samples warped into convex shapes having the warp amounts of +10 μm and +5 μm, the residual void number in the bonding material was equal to or greater than 10, but, when the warp amount was reduced and became +1 μm, the residual void number was reduced to 7, and when the warp amount became 0 μm, the residual void number was reduced to 3. Further, in the evaluation sample warped into a concave shape having the warp amount of −1 μm, the residual void number was reduced to 1, and the residual void number became 0 in the other evaluation samples having the warp amount greater than −1 μm.

The above results have proved that as the warp amount of the semiconductor chip warped into a convex shape decreases, the residual void number in the bonding material decreases, and when the warp amount becomes equal to an amount corresponding to a concave shape having the warp amount of 1 μm, the residual void number tends to approach 0. It has been proved that the formation of the semiconductor chip warped into a concave shape preferably having the warp amount of 1 μm or more allows the residual void number in the bonding material to be reduced, and a decrease in the residual void number in the bonding material in the semiconductor device allows the bonding material to be strengthened against external stress while having a high heat dissipation property. This has been proved that a highly reliable semiconductor device can be realized.

As described above, the semiconductor device according to the first embodiment includes the semiconductor chip 1 warped into a concave shape, the insulation substrate 3 on which the semiconductor chip 1 is mounted by bonding, the metal base plate 4 on which the insulation substrate 3 is mounted and that has a heat dissipation property, the resin section 6 that seals the insulation substrate 3 and the semiconductor chip 1, and the bumps 10 arranged in the joint between the semiconductor chip 1 and the insulation substrate 3, and the warp amount of the semiconductor chip 1 warped into a concave shape is equal to or greater than 1 μm and less than the height of the bumps 10.

Therefore, voids remaining in the bonding material 2a are easily released to the outside of the bonding material 2, which allows voids remaining in the bonding material 2a to be reduced.

When voids are mixed into the bonding material 2a under the semiconductor chip 1, the thermal resistance at the time of heat generation of the semiconductor chip 1 increases. Further, with the semiconductor device in which voids remain in the bonding material 2a, when stress is applied to the voids in the bonding material 2a during thermal cycling while the semiconductor device is in operation, the bonding material 2a becomes further deteriorated starting from the voids, which remarkably reduces long-term reliability of the semiconductor device.

With the semiconductor device according to the first embodiment, it is possible to reduce voids remaining in the bonding material 2a, so that deterioration of the bonding material 2a starting from the voids in the bonding material 2a can be suppressed. This allows a highly reliable semiconductor device to be realized.

Furthermore, since the bumps 10 are arranged in the bonding material 2a serving as the joint between the semiconductor chip 1 and the insulation substrate 3, it is possible to prevent the semiconductor chip 1 from being tilted during the process of bonding with bonding material 2a. This allows the bonding material 2a to have a required thickness and can suppress generation of an air layer in the bonding material 2a, which makes it possible to suppress deterioration of the heat dissipation property of the bonding material 2a.

Since the warp amount of the semiconductor chip 1 warped into a concave shape is equal to or greater than 1 μm and less than the height of the bumps 10, the bump structure can exhibit the effect of stabilizing the thickness of the bonding material 2a, and the bonding material 2a on the periphery of the semiconductor chip 1 has the largest thickness and the bonding material 2a at the center portion of the semiconductor chip 1 has the smallest thickness. While the semiconductor chip 1 is in operation, the center portion of the semiconductor chip 1 has the highest temperature, so that the heat dissipation is increased, and the reliability of the semiconductor device can be thereby increased.

The above configuration allows long-time use of the semiconductor device and allows an increase in yield of the semiconductor device.

The structure of the semiconductor chip 1 generates upward stress in the semiconductor chip 1, and when the thickness of the semiconductor chip 1 is equal to or less than 100 the semiconductor chip 1 tends to be warped into a convex shape and thereby causes voids to remain at the time of bonding. Therefore, with the semiconductor device according to the first embodiment, when the thickness of the semiconductor chip 1 is equal to or less than 100 μm, the void reduction effect can be more effectively exhibited.

As shown in FIG. 2, the collector electrode 9 is provided on the lower surface of the semiconductor chip 1, and the gate electrode 7 and the emitter electrode 8 having a linear expansion coefficient greater than a linear expansion coefficient of the collector electrode 9 are formed on the upper surface of the semiconductor chip 1. Further, as shown in FIG. 3, the collector electrode 9 is provided on the lower surface of the semiconductor chip 1, and the gate electrode 7 and the emitter electrode 8 that are thicker than the collector electrode 9 are provided on the upper surface of the semiconductor chip 1.

Therefore, causing stress to be generated on the upper surface side of the semiconductor chip 1 that is greater than stress generated on the lower surface side allows the semiconductor chip 1 having a required warp amount to be easily produced.

Further, the gate electrode 7 and the emitter electrode 8 are provided on the upper surface of the semiconductor chip 1, and the lead frame 5b and the lead frame 5c are bonded to the gate electrode 7 and the emitter electrode 8, respectively.

Therefore, even when upward stress is applied to the semiconductor chip 1, the semiconductor chip 1 is not brought into a convex shape, which makes it possible to suppress the wet-spreading of the bonding material 2a.

Second Embodiment

Figure 7:
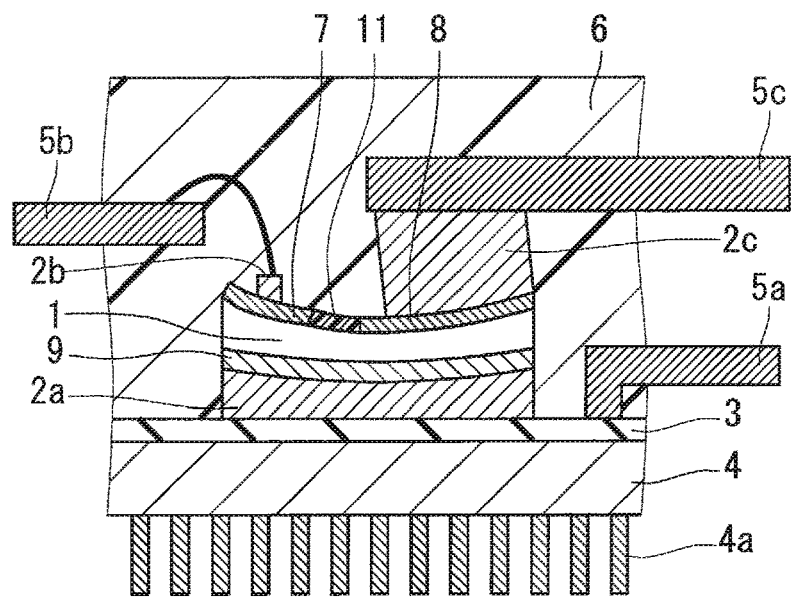
FIG. 7 is a cross-sectional view of a main part for describing a method for manufacturing a semiconductor device according to a second embodiment.
Figure 8:
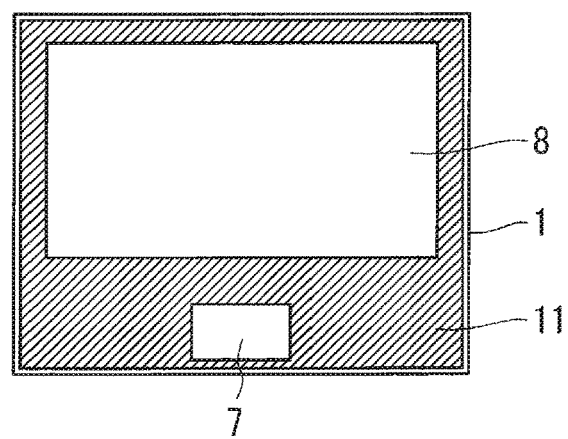
FIG. 8 is a plan view of a semiconductor chip of the semiconductor device according to the second embodiment.

Next, a semiconductor device according to a second embodiment will be described. FIG. 7 is a cross-sectional view of a main part for describing a method for manufacturing the semiconductor device according to the second embodiment. FIG. 8 is a plan view of a semiconductor chip 1 of the semiconductor device. Note that, in the second embodiment, the same components as those described in the first embodiment are denoted by the same reference numerals, and descriptions thereof will be omitted. Further, in FIG. 7, the bump 10 is omitted for the sake of easy viewing.

As shown in FIGS. 7 and 8, in the second embodiment, the method for warping the semiconductor chip 1 into a concave shape is different from the method in the first embodiment, and on the upper surface of the semiconductor chip 1, a thermosetting resin layer 11 having a linear expansion coefficient greater than the linear expansion coefficient of the semiconductor chip 1 is provided. More specifically, the thermosetting resin layer 11 is provided in a region on the upper surface of the semiconductor chip 1 where neither the gate electrode 7 nor the emitter electrode 8 is provided. The thermosetting resin layer 11 is a resin layer that results from heating a liquid thermosetting resin to cure the liquid thermosetting resin.

Note that, as the thermosetting resin, for example, a polyimide resin is used, but the thermosetting resin is not limited to such resin. Any resin may be used as long as the resin has desired elastic modulus, heat resistance, insulation property, and adhesiveness in addition to desired cure shrinkage and linear expansion coefficient. For example, in addition to the polyimide resin, an epoxy resin, a urethane resin, a silicone resin, a polyamide resin, a polyamideimide resin, an acrylic resin, or the like may be used.

Further, an application region of the thermosetting resin where the thermosetting resin layer 11 is formed is not particularly limited and may be any region as long as the region is capable of forming a required warp on the semiconductor chip 1.

In general, the thermosetting resin is applied using a dispenser when the application region is narrow with respect to the semiconductor chip 1, but the application is not limited to such a method. In a case of applying the resin to an entire surface of the semiconductor chip 1, dipping, spray application, or electrodeposition may be used to perform the application, but it is preferable to prevent the thermosetting resin from being applied to the region on the upper surface of the semiconductor chip 1 where the gate electrode 7 and the emitter electrode 8 are provided by a technique such as masking.

The thickness of the thermosetting resin is not particularly limited as long as the thermosetting resin is capable of forming a required warp on the semiconductor chip 1, but it is generally required that the thickness be equal to or greater than 5 μm. The thicker the thermosetting resin, the greater the warp of the semiconductor chip 1 can be.

Heating the semiconductor chip 1 to a predetermined curing temperature cures and shrinks the thermosetting resin. When being cured at the curing temperature of 250° C., for example, the thermosetting resin shrinks in accordance with a linear expansion coefficient by a difference from the room temperature. In general, the linear expansion coefficient of the semiconductor chip 1 is equal to or less than 5 ($10^{-6}$/K), but the linear expansion coefficient of the thermosetting resin is generally at least 15 ($10^{-6}$/K), and in many cases, 30 ($10^{-6}$/K). As the difference in linear expansion coefficient between the thermosetting resin and the semiconductor chip 1 increases, stress is generated on the upper surface side of the semiconductor chip 1, and the semiconductor chip 1 is warped into a concave shape by the stress.

Figure 9:
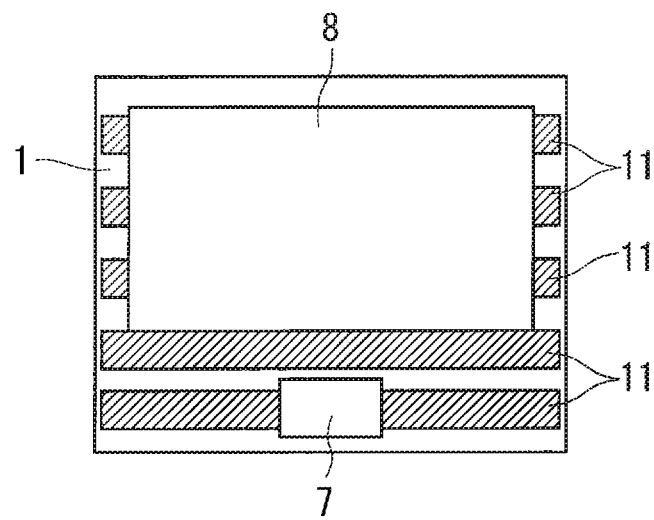
FIG. 9 is a plan view of a semiconductor chip of a semiconductor device according to a first modification of the second embodiment.
Figure 10:
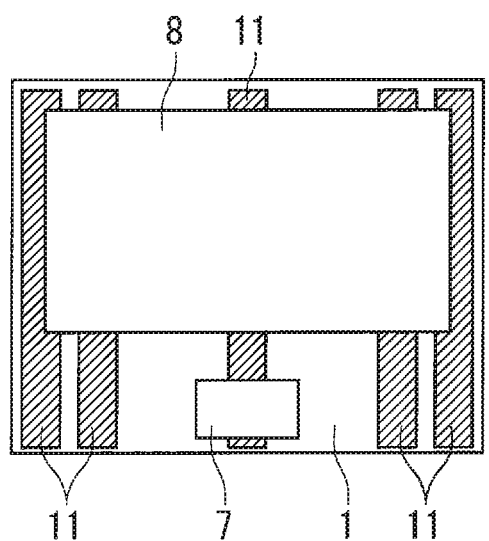
FIG. 10 is a plan view of a semiconductor chip of a semiconductor device according to a second modification of the second embodiment.

As shown in FIGS. 9 and 10, in order to increase the warp amount of the semiconductor chip 1, it is desirable that the thermosetting resin layer 11 be formed in a linear shape extending in one direction along the upper surface of the semiconductor chip 1. More specifically, it is desirable that the thermosetting resin be applied in a direction along the upper surface of the semiconductor chip 1 that is orthogonal to two sides facing each other on the upper surface of the semiconductor chip 1. FIG. 9 is a plan view of a semiconductor chip 1 of a semiconductor device according to a first modification of the second embodiment. FIG. 10 is a plan view of a semiconductor chip 1 of a semiconductor device according to a second modification of the second embodiment.

Since the thermosetting resin is applied in the direction along the upper surface of the semiconductor chip 1 that is orthogonal to two sides facing each other, stress is generated in a fixed direction, which allows the semiconductor chip 1 to be largely warped. In FIGS. 9 and 10, five thermosetting resin layers 11 are formed in a linear shape, but there is no limitation on the number of layers, and any number of layers may be formed as long as the semiconductor chip 1 can be deformed such that at least part of the periphery on the upper surface of the semiconductor chip 1 is higher in height than the center portion.

Further, since the warp amount of the semiconductor chip 1 depends on the thickness and width of the thermosetting resin, two or more kinds of thermosetting resins may be applied in order to partially control the warp of the semiconductor chip 1.

As described above, in the semiconductor device according to the second embodiment, the thermosetting resin layer 11 having the linear expansion coefficient greater than the linear expansion coefficient of the semiconductor chip 1 is provided on the upper surface of the semiconductor chip 1. More specifically, the thermosetting resin layer 11 is provided in a region on the upper surface of the semiconductor chip 1 where neither the gate electrode 7 nor the emitter electrode 8 is provided.

Therefore, causing large stress to be generated on the upper surface side of the semiconductor chip 1 allows the semiconductor chip 1 having the required warp amount to be easily produced.

The thermosetting resin layer 11 is formed in a linear shape extending in one direction along the upper surface of the semiconductor chip 1. Therefore, stress is generated in a fixed direction on the upper surface of the semiconductor chip 1, which allows the semiconductor chip 1 to be largely warped.

Although the present invention has been described in detail, the above descriptions are illustrative in all aspects, and the present invention is not limited by the descriptions. It is understood that innumerable modifications not illustrated can be envisaged without departing from the scope of the present invention.

Note that the present invention can be implemented by any combination of the embodiments within the scope of the present invention, and each of the embodiments can be modified or omitted as appropriate.

EXPLANATION OF REFERENCE SIGNS

1: semiconductor chip
3: insulation substrate
4: metal base plate
5b, 5c: lead frame
6: resin section
7: gate electrode
8: emitter electrode
9: collector electrode
10: bump
11: thermosetting resin layer.

The invention claimed is:

1. A semiconductor device comprising:
a semiconductor chip warped into a concave shape;
an insulation substrate on which the semiconductor chip is mounted by bonding;
a base plate on which the insulation substrate is mounted, the base plate having a heat dissipation property;
a resin section that seals the insulation substrate and the semiconductor chip; and
a bump disposed in a joint between the semiconductor chip and the insulation substrate, wherein
a warp amount of the semiconductor chip warped into a concave shape is equal to or greater than 1 µm and less than a height of the bump.

2. A semiconductor device comprising:
a semiconductor chip warped into a concave shape;
an insulation substrate on which the semiconductor chip is mounted by bonding;
a base plate on which the insulation substrate is mounted, the base plate having a heat dissipation property;
a resin section that seals the insulation substrate and the semiconductor chip;
an upper electrode provided on an upper surface of the semiconductor chip; and
a lead frame bonded to the upper electrode.

3. The semiconductor device according to claim 2, wherein
the bump is disposed in a joint between the semiconductor chip and the insulation substrate.

4. The semiconductor device according to claim 1, wherein
a thickness of the semiconductor chip is equal to or less than 100 µm.

5. The semiconductor device according to claim 1, further comprising:
a lower electrode provided on a lower surface of the semiconductor chip; and
an upper electrode provided on an upper surface of the semiconductor chip, the upper electrode having a linear expansion coefficient greater than a linear expansion coefficient of the lower electrode.

6. The semiconductor device according to claim 1, further comprising:
a lower electrode provided on a lower surface of the semiconductor chip; and
an upper electrode provided on an upper surface of the semiconductor chip, the upper electrode being thicker than the lower electrode.

7. The semiconductor device according to claim 1, further comprising a
thermosetting resin layer provided on an upper surface of the semiconductor chip, the thermosetting resin layer having a linear expansion coefficient greater than a linear expansion coefficient of the semiconductor chip.

8. The semiconductor device according to claim 2, further comprising a thermosetting resin layer provided in a region on the upper surface of the semiconductor chip where the upper electrodes is not provided, the thermosetting resin layer having a linear expansion coefficient greater than a linear expansion coefficient of the semiconductor chip.

9. The semiconductor device according to claim 7, wherein
the thermosetting resin layer is formed in a linear shape extending in one direction along the upper surface of the semiconductor chip.

10. The semiconductor device according to claim 2, wherein
a thickness of the semiconductor chip is equal to or less than 100 µm.

11. The semiconductor device according to claim 8, wherein
the thermosetting resin layer is formed in a linear shape extending in one direction along the upper surface of the semiconductor chip.

* * * * *